United States Patent
Tiemeijer et al.

[11] Patent Number: 5,838,004
[45] Date of Patent: Nov. 17, 1998

[54] PARTICLE-OPTICAL APPARATUS COMPRISING A FIXED DIAPHRAGM FOR THE MONOCHROMATOR FILTER

[75] Inventors: Peter Christiaan Tiemeijer; J. Chmelik; Pieter Kruit, all of Eindhoven, Netherlands

[73] Assignee: U.S. Philips Corporation, New York, N.Y.

[21] Appl. No.: 849,205
[22] PCT Filed: Oct. 1, 1996
[86] PCT No.: PCT/IB96/01029
§ 371 Date: Jun. 2, 1997
§ 102(e) Date: Jun. 2, 1997
[87] PCT Pub. No.: WO97/13268
PCT Pub. Date: Apr. 10, 1997

[30] Foreign Application Priority Data

Oct. 3, 1995 [EP] European Pat. Off. .............. 95202649

[51] Int. Cl.$^6$ .............................. H01J 37/05; H01J 37/04
[52] U.S. Cl. .............................................. 250/305
[58] Field of Search .................................. 250/305

[56] References Cited

U.S. PATENT DOCUMENTS

| | | | |
|---|---|---|---|
| 3,308,293 | 3/1967 | Mathams | 250/305 |
| 3,979,590 | 9/1976 | Andersen | 250/305 |
| 5,386,115 | 1/1995 | Freidhoff et al. | 250/281 |
| 5,448,063 | 9/1995 | DeJong et al. | 250/305 |

FOREIGN PATENT DOCUMENTS

0555911A1  8/1993  European Pat. Off. ......... H01J 37/05

*Primary Examiner*—Jack I. Berman
*Attorney, Agent, or Firm*—Dellett and Walters; Michael O. Scheinberg

[57] ABSTRACT

An electron microscope comprises an energy-selective filter (10) which is arranged ahead of the high-voltage field in the electron gun (2). Because the filter carries high-voltage potential and is arranged within the gun space (14) which is filled with $SF_6$ gas, problems arise regarding electrical and mechanical passages to the filter. Notably the centering of the filter is problematic. In order to enable suitable aperture adjustment of the filter nevertheless (for current limitation and for avoiding optical aberrations introduced into the beam by the filter), there is provided an entrance diaphragm (30) which is rigidly connected to the filter parts, notably to a pole face or to a field-defining closing piece (48a) of the filter.

5 Claims, 3 Drawing Sheets

PARTICLE-OPTICAL APPARATUS COMPRISING A FIXED DIAPHRAGM FOR THE MONOCHROMATOR FILTER

The invention relates to a particle-optical apparatus, comprising a particle source for producing a primary beam of electrically charged particles, which particle source comprises high-voltage means for establishing within the particle source an accelerating high-voltage field which is to be traversed by the particles, and a monochromator filter assembly which is situated substantially completely ahead of the high-voltage field within the source so as to select from the primary beam a sub-beam with an energy dispersion which is less than that of the primary beam.

An apparatus of this kind is known from U.S. Pat. No. 5,300,775.

In a particle-optical apparatus, for example an electron microscope, a low energy dispersion in the particle beam (electron beam) is generally desirable. This is because the energy dispersion in the electron beam, in conjunction with the chromatic aberration of the imaging lens or lenses, degrades the resolution of the image of the electron microscope. A low energy dispersion is desired notably in electron microscopes in which electron spectroscopy is carried out, i.e. electron microscopes in which the energy loss of the electron beam in the sample to be studied is determined in dependence on the location on the sample. Conclusions regarding the composition of the sample can be drawn on the basis thereof. The contrast in the image of the sample can also be enhanced by selecting exclusively electrons with a given energy loss to participate in imaging. For these situations it is necessary to have an irradiating electron beam with a low energy dispersion available. This can be achieved by arranging an energy-dispersive element, also referred to as a filter assembly, in the irradiating beam. This enables energy selection by deflecting the electrons, i.e. by spatially separating the electrons, in dependence on their energy and, if necessary, by selecting the electrons of the desired energy.

The cited United States Patent document discloses an electron microscope which comprises an energy-dispersive unit (a filter assembly) for energy selection in an electron beam. As is customary in such apparatus, the electron microscope comprises an electron gun provided with an electron source for producing a primary electron beam, i.e. an electron beam which has not yet been subjected to energy selection. Moreover, the gun can be introduced into an accelerating potential (i.e. an accelerating high-voltage field) in order to accelerate the electrons in the beam. The filter assembly is arranged in the gun in the vicinity of the electron source, so that the electrons enter the filter assembly with a comparatively low energy (for example, of the order of magnitude of 3 kV). This has the advantage that the filter may have a comparatively compact construction because the dimension of a filter for an electron beam is determined, generally speaking by the energy of the beam to be filtered. The compact construction of such a filter enables it to be built into an electron microscope of an existing design, without extensive modification of the apparatus being required.

The described arrangement of the filter assembly ahead of the high-voltage field, however, also has a number of drawbacks. A first drawback is due to the fact that the accelerating electrode (the anode) in the electron gun of an electron microscope carries ground potential, so that the electron source carries the negative accelerating high voltage of the order of magnitude of −300 kV. Consequently, the filter assembly also carries approximately this high voltage (since it is arranged ahead of the accelerating field), so that manipulation of the filter component is substantially obstructed and almost impossible in practice.

A second drawback is due to the fact that for high-voltage insulation many electron microscopes comprise an envelope around the gun space containing an insulating gas, such as sulphur fluoride ($SF_6$). The accessibility of the filter assembly is thus strongly reduced. The formation of passages, either mechanical or electrical, through this gas-filled space gives rise to problems as regards the gas-tightness and also as regards the electrical insulation of the passages. (The existing electrical connections to the electron gun are fed in via a high-voltage cable of standard design which has been taken into account for design of the microscope. However, this standard cable is not suitable for transmitting electrical signals other than those for which it has been designed).

A third drawback is due to the fact that it would be necessary to make holes for passages in the microscope column of an electron microscope which may already have been installed at a customer. This would necessitate complete disassembly, involving contamination of the vacuum space of the microscope, and also the transporting of heavy precision tools.

Notably the alignment of the various filter components relative to one another and to the remainder of the electron microscope is seriously hampered by the above problems.

It is an object of the invention to provide a particle-optical apparatus of the kind set forth in which the filter assembly in the electron gun necessitates only a minimum number of passages through the wall of the apparatus. To this end, the particle-optical apparatus in accordance with the invention is characterized in that there is provided a diaphragm which is situated at the entrance side of the monochromator filter assembly and is rigidly connected to a part of the monochromator filter assembly in normal operating conditions.

In the context of the present invention the term "rigidly connected" is not intended to mean that the entrance diaphragm cannot be detached, but that it is not adjustable during normal operation of the particle-optical apparatus.

As a result of these steps it is achieved that, because of the rigid connection, the diaphragm can be accurately centered (outside the electron microscope) with respect to the filter assembly, if necessary by utilizing centering tools.

These steps also enable the filter assembly to transmit adequate beam current (order of magnitude: 50 nA) so as to achieve suitable imaging in the electron microscope, notably in a transmission electron microscope, by a suitable choice of the diaphragm aperture; however, on the other hand it is ensured that this current does not become many orders of magnitude too large, because the energy dispersion in the beam by interaction of the beam electrons (the so-called Boersch effect) must be prevented.

It would be feasible to achieve the desired limitation of the beam current by utilizing an aperture of very small dimensions in the extraction electrode in the electron gun; however, the beam emanating therefrom is then so narrow that alignment of the filter assembly relative to the primary beam becomes highly problematic. As a result of the steps in accordance with the invention, a wide beam emanates from the extraction electrode, so that the entrance diaphragm is always exposed by this beam and hence no centering problems occur.

The arrangement of the diaphragm in accordance with the invention also offers the advantage that the lens aberrations due to electrons which are incident too far from the optical axis are avoided in the filter; such lens aberrations could not be reduced by beam limiting behind the filter (i.e. the lens aberrations which cause the electrons of undesirable direction to cross the optical axis behind the filter).

In an embodiment of the invention the filter assembly is constructed as a Wien filter. This filter is preferably provided with a permanent magnet for generating the magnetic field of the filter.

It is thus achieved that it is not necessary to feed electrical conductors for generating the magnetic field into the space in the electron microscope in which the filter is situated.

These and other aspects of the invention will be apparent from and elucidated with reference to the embodiments described hereinafter.

Figure 1:
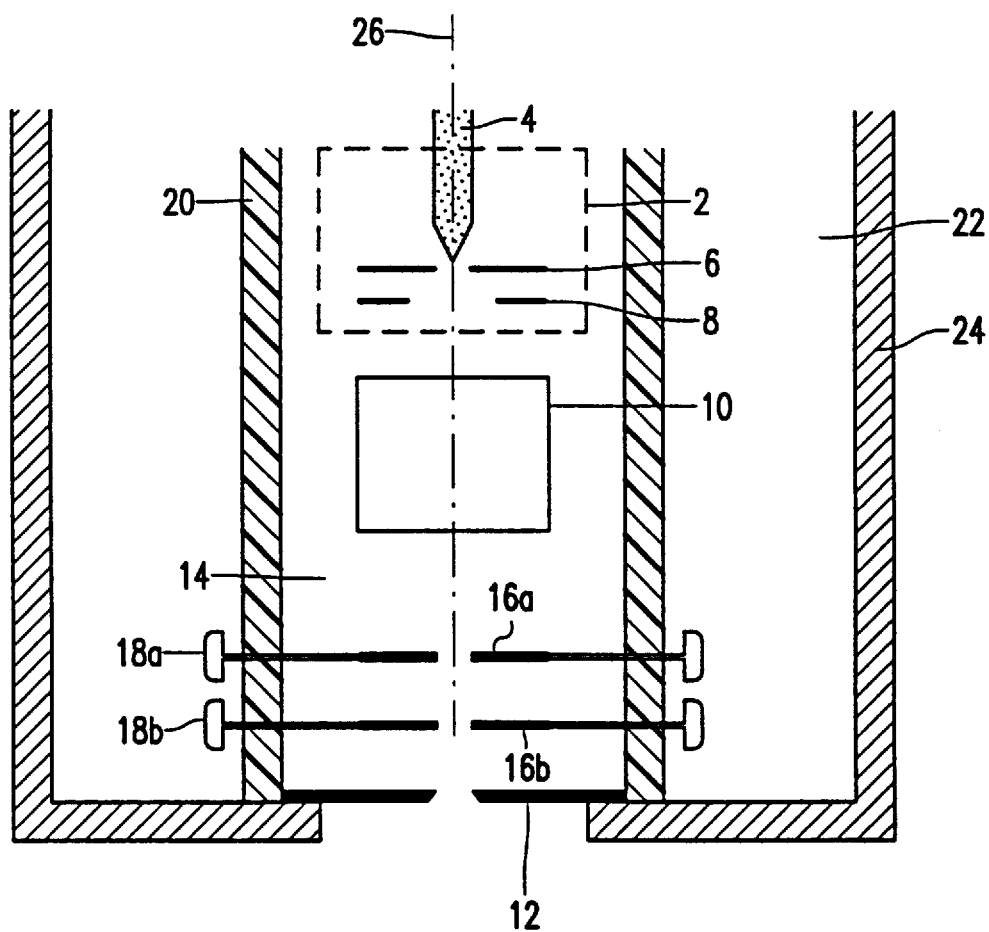
FIG. 1 is a diagrammatic sectional view taken in a plane through the optical axis of the parts of relevance of an electron microscope comprising the filter assembly in accordance with the invention.

FIG. 1 is a diagrammatic sectional view taken in a plane through the optical axis of the parts of relevance of a particle-optical apparatus, notably an electron microscope, comprising the filter assembly in accordance with the invention. The electron microscope comprises a particle source 2, notably an electron source, for producing a primary beam of electrons which is not shown in this Figure. The electron source 2 of the present embodiment is constructed as a field emission source which comprises an emissive tip 4, an extraction electrode 6 and a lens-effect electrode 8 which forms a gun lens for controllably conducting the electron beam from the electron gun to the other components of the electron microscope. The assembly formed by the tip and said two electrodes constitutes an electrostatic lens which exerts a focusing effect on the primary electron beam produced bad the tip.

The electron source 2 also comprises high-voltage means for establishing, in the electron source, an accelerating high-voltage field to be traversed by the particles. The high-voltage means comprise a high-voltage generator (not shown in the Figure) which can supply the tip and said electrodes with a high-voltage of the order of magnitude of −300 kV with respect to ground potential during operation of the electron microscope. The extraction electrode then carries a voltage of the order of magnitude of approximately 4 kV with respect to the tip, whereas the lens- effect electrode is adjusted to a voltage of the order of magnitude of 2 kV with respect to the tip.

The electrons ultimately emanate from the electron source via an aperture in the anode 12 which carries ground potential. The electrons have then been exposed to an accelerating potential difference of approximately 300 kV, corresponding to an accelerating electrostatic high-voltage field present between the tip 4 and the anode 12 in the gun space 14. In order to distribute said field uniformly across the space 14 in the vertical direction, a number of for example, 8 disc-shaped electrodes are arranged in said space, two of which (16a and 16b) are shown. The electrodes 16a and 16b are connected to a high voltage which is valued between said −300 kV and ground potential and whose value uniformly increases as a function of the distance from the tip. The space 14 is enclosed by a wall 20 of an insulating material such as aluminium oxide ($Al_2O_3$).

For application of the high voltage to the disc-shaped electrodes 16a and 16b these electrodes are provided with high-voltage terminals 18a and 18b. The high-voltage terminals extend to the electrodes 16a and 16b through the wall 20; they are situated in a space 22 which is filled with gaseous sulphur fluoride ($SF_6$) for the purpose of high-voltage insulation. The space 22 itself is enclosed by a gastight wall 24.

In the space 14 a monochromator filter assembly 10 is arranged underneath the lens-effect electrode and above the electrodes 16a and 16b in order to achieve a uniform high voltage distribution; the optical axis 26 of the filter assembly coincides as well as possible with the optical axis of the electron microscope. This filter assembly is intended to select from the primary electron beam emanating from the tip a sub-beam with an energy dispersion which is less than that of the primary beam. The construction and the properties of this filter assembly will be described in detail with reference to the other Figures.

Figure 2:
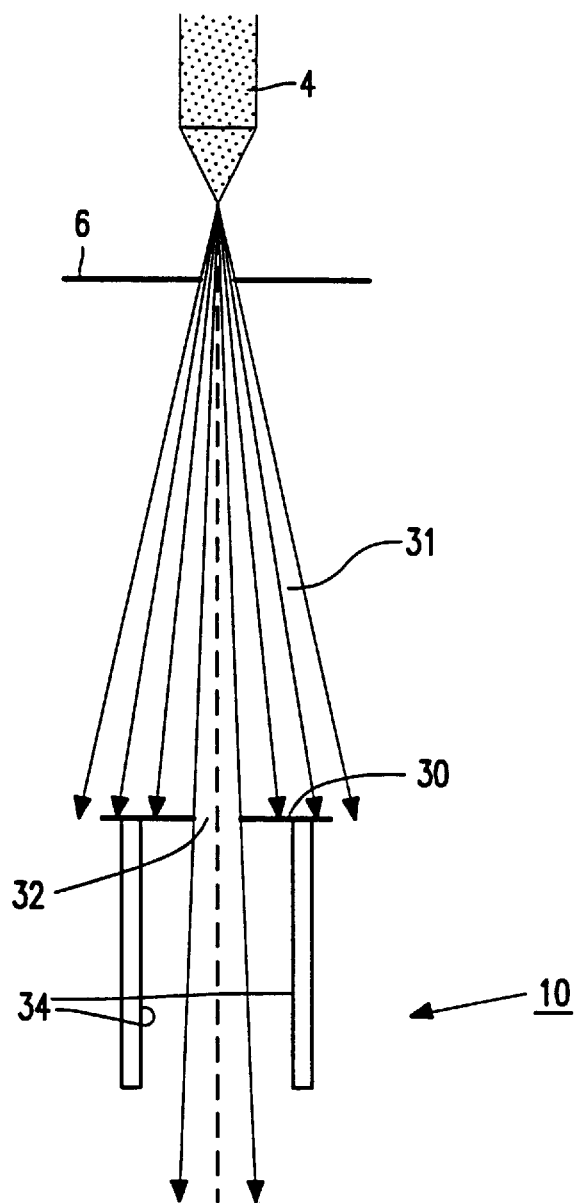
FIG. 2 illustrates the beam path in the filter assembly in accordance with the invention.

FIG. 2 illustrates the beam path in the filter assembly 10 in accordance with the invention. In this Figure the filter assembly 10 is diagrammatically represented by an entrance diaphragm 30 whose aperture 32 is shown in exaggerated form for the sake of clarity. The filter assembly 10 is constructed as a known Wien filter, consisting of a pole system for generating a magnetic field and an electrode system for generating an electrostatic field. The magnetic field is generated, for example by a set of magnet poles 34, so that the field lines of the magnetic field extend in the plane of drawing. The electrostatic field extends perpendicularly to the plane of drawing and is produced by two flat electrodes (not shown in the Figure) which extend parallel to the plane of drawing.

In FIG. 2 the primary beam 31 is limited by the aperture of the extraction electrode 6. If the limiting aperture is large, the beam current in the Wien filter will be so large that in the focusing range of the filter a strong interaction occurs between the electrons in the beam, the so-called Boersch effect, so that energy dispersion occurs in the filter. In this situation energy dispersion is undesirable and, therefore, the current in the Wien filter must be limited to such an extent that (noticeable) energy dispersion no longer occurs. A suitable value for the beam current in a practical set-up is, for example 50 nA. To this end there is provided an entrance diaphragm 30 having an aperture which is substantially smaller than the aperture 32 shown in FIG. 2. The aperture 32 has a diameter of, for example 100 $\mu$m, whereas the aperture in the extraction electrode 6 has a diameter of, for example 400 $\mu$m. The diaphragm 30 is rigidly connected to the magnetic pole shoes 34; it is alternatively possible to connect said diaphragm rigidly to a closing piece for closing (defining) the magnetic field, if present.

Figure 3A:
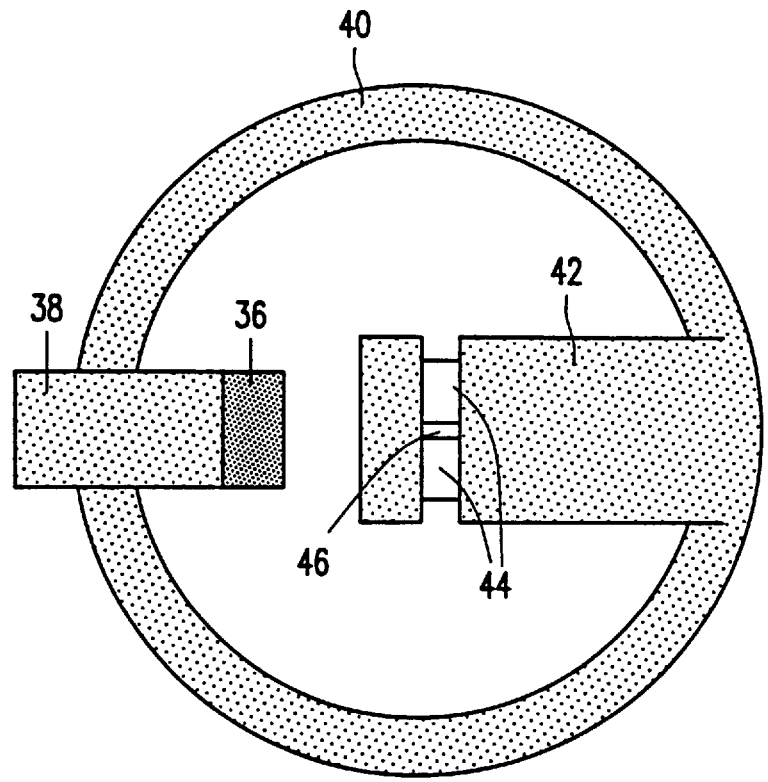
FIG. 3a is a diagrammatic plan view of the filter assembly in accordance with the invention.
Figure 3B:
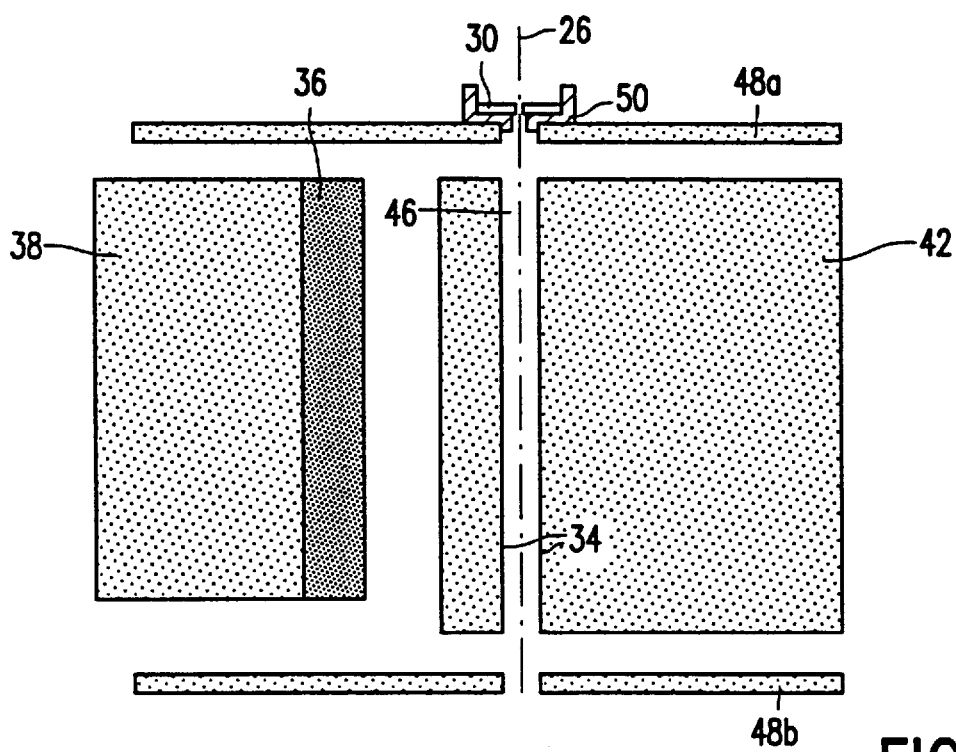
FIG. 3b is a diagrammatic sectional view taken in a plane through the optical axis of the filter assembly in accordance with the invention.

FIG. 3a is a diagrammatic plan view of the filter assembly 10 in accordance with the invention and FIG. 3b is a sectional view thereof, taken in a plane through the optical axis 26. The magnetic field in the space 46 is generated by means of a magnetic circuit, consisting of a permanent magnetic part 36 which is in contact with an iron circuit 38, 40, 42. The latter circuit is made of a material having a high magnetic permeability, for example iron, and serves to conduct the magnetic flux from the permanent magnet 36 to the space 46. At the magnetic side the space 46 is bounded by the pole shoes 34. The electric field is generated by the electrodes 44 which have been omitted in FIG. 3b for the sake of clarity. Because of the use of the permanent magnet 36 for generating the magnetic field, electric supply leads as would be required for excitation coils are no longer necessary. FIG. 3b shows magnetic closing pieces 48a and 48b. If desired, the entrance diaphragm 30 can be rigidly connected, via a holder 50, to the closing piece 48a at the entrance of the filter assembly 10.

We claim:

1. A particle-optical apparatus, comprising a particle source (2) for producing a primary beam (31) of electrically charged particles, which particle source comprises high-voltage means (16a, 16b) for establishing within the particle source an accelerating high-voltage field which is to be traversed by the particles, and a monochromator filter assembly (10) which is situated substantially completely ahead of the high-voltage field within the source so as to select from the primary beam a sub-beam with an energy dispersion which is less than that of the primary beam, characterized in that there is provided a diaphragm (30) which is situated at the entrance side of the monochromator filter assembly (10) and is rigidly connected to a part (48a) of the monochromator filter assembly in normal operating conditions.

2. A particle-optical apparatus as claimed in claim 1, in which the monochromator filter assembly (10) comprises a Wien filter.

3. A particle-optical apparatus as claimed in claim 2, in which the filter assembly (10) comprises a permanent magnet (36) for generating the magnetic field of the filter.

4. A particle-optical apparatus as claimed in claim 3, characterized in that the diaphragm (30) is connected to a pole face or a field-defining closing piece (48a) of the magnetic circuit of the Wien filter.

5. A particle-optical apparatus as claimed in claim 2, characterized in that the diaphragm (30) is connected to a pole face or a field-defining closing piece (48a) of the magnetic circuit of the Wien filter.

* * * * *